(12) United States Patent  (10) Patent No.: US 9,105,568 B2
Iuliano et al.  (45) Date of Patent: Aug. 11, 2015

(54) SEMICONDUCTOR DEVICE WITH INTEGRATED MAGNETIC ELEMENT PROVIDED WITH A BARRIER STRUCTURE AGAINST METAL CONTAMINATION, AND MANUFACTURING

(71) Applicant: STMicroelectronics S.r.l., Agrate Brianza (MB) (IT)

(72) Inventors: Paolo Iuliano, Villa D'adda (IT); Francesca Milanesi, Milan (IT); Vincenzo Palumbo, Vimercate (IT); Sonia Pirotta, Ronco Briantino (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 12 days.

(21) Appl. No.: 14/104,934

(22) Filed: Dec. 12, 2013

(65) Prior Publication Data

US 2014/0167193 A1 Jun. 19, 2014

(30) Foreign Application Priority Data

Dec. 14, 2012 (IT) .............................. TO2012A1080

(51) Int. Cl.
| | |
|---|---|
| *H01L 27/22* | (2006.01) |
| *H01L 43/14* | (2006.01) |
| *G01R 33/00* | (2006.01) |
| *H01L 43/04* | (2006.01) |
| *H01L 27/06* | (2006.01) |

(52) U.S. Cl.
CPC ............ *H01L 27/22* (2013.01); *G01R 33/0052* (2013.01); *H01L 43/04* (2013.01); *H01L 43/14* (2013.01); *H01L 27/0688* (2013.01)

(58) Field of Classification Search
CPC ...................................................... H01L 27/22
USPC ........................................................ 257/427
See application file for complete search history.

(56) References Cited

U.S. PATENT DOCUMENTS

| | | |
|---|---|---|
| 5,262,666 A | 11/1993 | Yoshino et al. |
| 6,211,090 B1 | 4/2001 | Durlam et al. |
| 6,358,756 B1 * | 3/2002 | Sandhu et al. .................... 438/3 |

(Continued)

FOREIGN PATENT DOCUMENTS

WO WO 03077258 A2 9/2003

OTHER PUBLICATIONS

Italian Search Report and Written Opinion dated Aug. 8, 2013 from corresponding Italian Application No. TO2012A001080.

*Primary Examiner* — Jami M Valentine
(74) *Attorney, Agent, or Firm* — Allen, Dyer, Doppelt, Milbrath & Gilchrist, P.A.

(57) ABSTRACT

A semiconductor device including: a semiconductor body having a first side and a second side opposite to one another; a first barrier element, which extends over the first side of the semiconductor body and is made of a first material configured to act as barrier against metal ions, for example chosen from among titanium, tantalum, titanium alloys or compounds, tantalum alloy; a magnetic element, which extends over the first barrier layer and is made of a second material having magnetic properties, for example a ferromagnetic material; a second barrier element, which extends over the magnetic layer and is made of a third material configured to act as barrier against metal ions, for example chosen from among titanium, tantalum, titanium alloys or compounds, tantalum alloys or compounds. The first and second barrier elements form a top encapsulating structure and a bottom encapsulating structure for the magnetic element.

20 Claims, 5 Drawing Sheets

(56) References Cited

U.S. PATENT DOCUMENTS

| | | | |
|---|---|---|---|
| 6,812,141 B1 * | 11/2004 | Gaidis et al. | 438/637 |
| 2005/0095855 A1 | 5/2005 | D'urso et al. | |
| 2006/0019431 A1 * | 1/2006 | Kasko et al. | 438/124 |
| 2011/0111532 A1 * | 5/2011 | Ryu et al. | 438/3 |

* cited by examiner

SEMICONDUCTOR DEVICE WITH INTEGRATED MAGNETIC ELEMENT PROVIDED WITH A BARRIER STRUCTURE AGAINST METAL CONTAMINATION, AND MANUFACTURING

CROSS REFERENCE TO RELATED APPLICATION

This application claims priority to Italian Patent Application No. TO2012A001080, filed Dec. 14, 2012, which is hereby incorporated by reference to the maximum extent allowable by law.

BACKGROUND

1. Technical Field

The present disclosure relates to a semiconductor device having an integrated magnetic element and provided with a barrier structure against metal contamination, and to a method for manufacturing the semiconductor device. In particular, the semiconductor device includes a magnetic element and the barrier structure is designed to protect, during the manufacturing steps of the semiconductor device, the semiconductor device itself from metal contamination deriving from formation of the magnetic element. Moreover, the barrier structure also protects from metal contamination the equipment used during the steps of manufacturing the semiconductor device.

2. Discussion of the Related Art

In processes of micromachining of semiconductor wafers, in particular for the production of electronic devices, it is of fundamental importance to prevent or reduce metal contamination (typically, but not only, surface contamination) of the semiconductor wafer itself.

For example, integration of a thin ferromagnetic layer in a standard CMOS or CMOS-compatible process enables creation of integrated magnetic-field sensors, such as Fluxgate and Hall-effect sensors, which are able to detect external magnetic fields.

Contamination due to metal ions of the wafer being machined may be caused, for example, by the step of formation of the ferromagnetic layer and/or on account of contaminants already present in the deposition chamber due to previous manufacturing steps.

As is known, alloys with magnetic properties generally contain metals (such as, for example, iron, cobalt, platinum, molybdenum), which, in processes for manufacturing semiconductor devices, constitute contaminating elements for the devices themselves. However, numerous electronic devices or MEMS devices make use of magnetic elements formed in an integrated form with known steps of deposition and definition by selective etching (for example, but not only, Hall-effect sensors, DC-DC converters, transformers, etc.).

According to the known art, in order to reduce metal contamination of the wafer being machined there are carried out, for example, steps of surface etching of the wafer so as to remove any possible surface contaminants, and/or machinery is used for deposition/etching free from contaminants (or after verification that the contamination due to the above contaminants is lower than a certain tolerance threshold).

A method used for detecting the presence of metal contaminants is X-ray fluorescence (XRF) spectroscopy, or total-reflection X-ray fluorescence (TR-XRF) spectroscopy. The techniques of XRF or TR-XRF analysis are non-destructive techniques that make it possible to know the composition of a specimen analysed through study of the X-ray fluorescence emitted by the atoms of the specimen following upon excitation, which is typically obtained by irradiating the specimen with high-energy X and gamma rays.

However, it is evident that an analysis by means of XRF spectroscopy is a method control, and not prevention, of contamination. In addition, the confirmation of a contamination of the wafer beyond a minimum threshold means said wafer should be discarded.

Likewise, removal of metal contaminants by etching proves to be an invasive technique, which is not always usable and does not guarantee a complete elimination of the contaminants.

FIGS. 1-7 show manufacturing steps of a known type for the formation of a generic metal or magnetic element on a semiconductor wafer. The steps of FIGS. 2-6 entail a risk of contamination of the wafer and/or of the manufacturing equipment used during said step.

With reference to FIG. 1, a wafer 10 is provided made of semiconductor material, for example silicon, comprising a substrate 1. The substrate 1 may be of a previously machined type (in a way not shown in detail in FIG. 1) and may comprise, for example, electronic devices or portions (for example, implanted regions) of electronic devices designated by way of example by the reference number 9.

Once again with reference to FIG. 1, grown on the substrate 1 is an intermediate layer 2, for example an oxide layer. The intermediate layer 2 has a thickness for example of between 0.2 μm and 2 μm.

Then, FIG. 2, deposited (for example, by sputtering) on the wafer 10, in particular on the intermediate layer 2, is a layer 3 of magnetic (in particular, ferromagnetic) material, for example nickel-iron (NiFe), cobalt-iron-boron-silicon (CoFeSiB) or else cobalt-zirconium-tantalum (CoZrTa), or other magnetic material or magnetic alloy.

The step of FIG. 2 may entail a contamination of the wafer 10 by metal ions deriving from the step of formation of the magnetic layer 3. In particular, the contamination may regard a surface portion of the intermediate layer 2, but may extend even deep into the intermediate layer 2, as far as the substrate 1.

A possible solution could include the step of providing the intermediate layer 2 with a large thickness, but this would render more complex the provision of possible deep vias through the intermediate layer 2, in addition to increasing the thickness of the wafer 10 in an undesirable way.

The contamination deriving from metal ions may jeopardize even significantly operation of the electronic devices 9 in so far as undesirable metal ions concur in modifying the characteristics of conductivity of the regions in which they are present.

Then, FIGS. 3 and 4, a step of definition of the magnetic layer 3 is carried out, via a mask 4 made of photoresist or of some other material (e.g., "hard mask").

The step of FIG. 3, where the mask 4 is formed on the wafer 10, may entail a contamination of the equipment used to form the mask, for example, in the case of a photoresist mask 4, of the equipment for spinning the photoresist and/or for photolithography in so far as in both steps the magnetic layer 3 is at least partially exposed.

Also the step of FIG. 4, where the magnetic layer 3 is removed selectively by wet etching or dry etching, may entail a contamination of the etching equipment. The step of FIG. 4 enables definition of the magnetic layer 3 so as to provide on the wafer 10 a magnetic element 3' having a desired shape for the specific application.

Next (FIG. 5), the mask 4 is removed. Also this step may lead to a contamination of the etching equipment owing to removal of the mask 4, in so far as the magnetic layer 3 is exposed at the end of etching of the mask 4.

Next (FIG. 6), there follow subsequent steps of manufacture of the wafer 10, for example a step of passivation of the wafer 10 to protect the exposed magnetic element 3'. In a known way, a protective layer 6 is formed on the wafer 10, in particular over the magnetic element 3' and alongside the magnetic element 3'. Also this step exposes the equipment used for formation of the protective layer 6 to risks of metal contamination in so far as the magnetic element 3' is exposed during the step of formation (e.g., by passivation) of the protective layer 6.

Then (FIG. 7), this is followed by further manufacturing steps, for example opening of contacts 8 through the protective layer 6, designed, for instance, to provide an electrical contact from/to the magnetic element 3'.

It is evident from the description of the steps of FIGS. 2-6 that the risks of contamination of the wafer 10 and/or of the equipment used for manufacture thereof are multiple and can be difficult to control. Detection of the contamination of the equipment leads to suspension of use thereof awaiting a thorough cleaning step, with consequent obvious disadvantages.

In fact, ferromagnetic materials generally contain iron, nickel, cobalt, and other contaminating elements, which, in some cases, may lead to the failure of the electronic components 9 integrated in the wafer 10. Consequently, the wafers should be machined using dedicated equipment after deposition of the ferromagnetic material. The more technological steps are carried out after deposition of the ferromagnetic material, the greater the number of items of equipment that are used just for machining the wafers with the magnetic sensors, and the higher the costs involved.

SUMMARY

An embodiment provides a semiconductor device having a barrier structure against metal contamination and a method for manufacturing the semiconductor device that will address at least some of the drawbacks of the known art.

According to an embodiment, there is provided a method for manufacturing a semiconductor device, comprising the steps of:

(a) providing a semiconductor body, having a first side and a second side opposite to one another;

(b) forming, over the first side of the semiconductor body, a first barrier element made of a first material configured to act as barrier against metal ions;

(c) forming, over the first barrier layer, a magnetic element made of a second material having magnetic properties; and (d) forming, over the magnetic layer, a second barrier element made of a third material configured to act as barrier against metal ions.

According to an embodiment, step (c) includes forming the magnetic element completely overlying the first barrier element, and step (d) includes forming the second barrier element completely overlying the magnetic element.

According to an embodiment, the first and third materials are configured to act as barrier against metal ions of said second material.

According to an embodiment, the first and third materials are chosen from among: titanium, tantalum, compounds or alloys of titanium including TiN and TiW, compounds or alloys of tantalum including TaNTa, TaN, and $Ta_2N$.

According to an embodiment, the second material is a ferromagnetic material, including CoZrTa, NiFe, CoFeHfO, CoFeSiB, CoZrO.

According to an embodiment, steps (b), (c) and (d) include, respectively: depositing, on the first side of the semiconductor body, the first material to form a first barrier layer; depositing, on the first barrier layer, the second material to form a magnetic layer; and depositing, on the magnetic layer, the third material to form a second barrier layer, step (b) further including removing selective portions of said first barrier layer, step (c) further including removing selective portions of said magnetic layer, and step (d) further including removing selective portions of said second barrier layer.

According to an embodiment, the steps of depositing the first barrier layer, the magnetic layer, and the second barrier layer are carried out in one and the same reaction chamber.

According to an embodiment, the steps of removing selective portions of the first barrier layer of the magnetic layer and of the second barrier layer are carried out in the same etching chamber.

According to an embodiment, the method further comprises, before carrying out the steps of removing selective portions of the first barrier layer, of the magnetic layer, and of the second barrier layer, the step of forming a photoresist mask on the second barrier layer, said mask outlining, in top view, a desired shape of the first barrier element, of the magnetic element, and of the second barrier element.

According to an embodiment, the method further comprises the step of forming a protective layer over the first side of the semiconductor body in such a way as to cover the first barrier element, the magnetic element, and the second barrier element.

According to an embodiment, the method further comprises forming one or more electronic components integrated in said semiconductor body.

According to an embodiment, the method further comprises the steps of forming at least one first conductive pad on the first side of, or integrated in, the semiconductor body, alongside the first barrier element, the magnetic element, and the second barrier element; electrically coupling said first conductive pad to said one or more electronic components; and removing selective portions of the protective layer so as to render said first conductive pad accessible.

According to an embodiment, the method further comprises the step of forming an intermediate insulating layer, made of dielectric material, between the semiconductor body and the first barrier layer.

According to an embodiment, said semiconductor device is chosen from among: integrated magnetic sensor for detecting external magnetic fields, contactless current sensor based upon the Hall effect, proximity magnetic-field sensor, integrated DC-DC converter, integrated transformer, and MEMS device.

According to an embodiment, there is provided a semiconductor device, comprising a semiconductor body, having a first side and a second side opposite to one another; a first barrier element, made of a first material configured to act as barrier against metal ions, which extends over the first side of the semiconductor body; a magnetic element, made of a second material having magnetic properties, which extends over the first barrier layer; and a second barrier element, made of a third material configured to act as barrier against metal ions, which extends over the magnetic layer.

According to an embodiment, the magnetic element overlies completely the first barrier element, and the second barrier element overlies completely the magnetic element.

According to an embodiment, the first and third materials are configured for acting as barrier against metal ions of said second material.

According to an embodiment, the first and third materials are chosen from among: titanium, tantalum, compounds or alloys of titanium including TiN and TiW, compounds or alloys of tantalum including TaNTa, TaN and $Ta_2N$.

According to an embodiment, said second material is a ferromagnetic material, including CoZrTa, NiFe, CoFeHfO, CoFeSiB, CoZrO.

According to an embodiment, the semiconductor device further comprises a protective layer, which extends over the first side of the semiconductor body in such a way as to cover the first barrier element, the magnetic element, and the second barrier element.

According to another embodiment, the semiconductor device further comprises one or more electronic components integrated in said semiconductor body.

According to another embodiment, the semiconductor device further comprises at least one first conductive pad set on the first side of, or integrated in, the semiconductor body, alongside the first barrier element, the magnetic element, and the second barrier element; an electrical connection configured for electrically coupling said first conductive pad to said one or more electronic components; and a first conductive plug, which extends through the protective layer and is electrically coupled to said first conductive pad.

According to another embodiment, the semiconductor device further comprises an intermediate insulating layer, made of dielectric material, which extends between the semiconductor body and the first barrier element.

According to another embodiment, the semiconductor device is chosen from among: integrated magnetic sensor for detecting external magnetic fields, contactless current sensor based upon the Hall effect, proximity magnetic-field sensor, integrated DC-DC converter, integrated transformer, and MEMS device.

BRIEF DESCRIPTION OF THE DRAWINGS

For a better understanding of the embodiments, they are now described, purely by way of non-limiting example, with reference to the attached drawings, wherein.

DETAILED DESCRIPTION

Provided according to the embodiments is a semiconductor device comprising: a semiconductor body, having a first side and a second side opposite to one another; a first barrier element, which extends over the first side of the semiconductor body and is made of a first material configured to act as barrier against metal ions, for example chosen from among titanium, tantalum, titanium alloy, including TiN and TiW, tantalum alloy, including TaNTa and TaN; a magnetic element, which extends over the first barrier layer and is made of a second material having magnetic properties, for example a ferromagnetic material, in particular chosen from among CoZrTa, NiFe, CoFeHfO, CoFeSiB, CoZrO; a second barrier element, which extends over the magnetic layer and is made of a third material configured to act as barrier against metal ions, for example chosen from among titanium, tantalum, titanium alloy, including TiN and TiW, tantalum alloy, including TaNTa and TaN. The first and second barrier elements form a top encapsulating (or protective) structure and a bottom encapsulating (or protective) structure for the magnetic element.

According to one embodiment, the first barrier element, the magnetic element, and the second barrier element extend substantially completely on top of one another.

There now follows a description, with reference to FIGS. 8-15, of a method for manufacturing a semiconductor device according to an embodiment.

Figure 8:
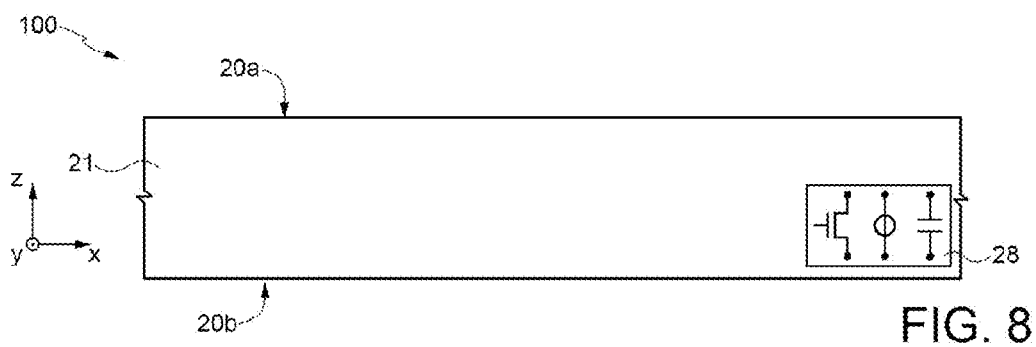
FIGS. 8-15 show, in lateral cross-sectional view, steps for manufacturing a semiconductor device including a magnetic element and a barrier structure against metal contamination according to one embodiment of the present invention.

With reference to FIG. 8, a wafer 100 is provided that includes a semiconductor body 20 including a substrate 21 of semiconductor material, such as, for example, silicon (Si), silicon carbide (SiC), silicon germanide (SiGe), gallium cyanide (GaN), gallium arsenide (GaAs), etc.

The semiconductor body 20 is delimited by a first side 20a and a second side 20b, opposite to one another in a direction Z.

According to one embodiment, the semiconductor body 20 coincides with the substrate 21 and is of a type that has not previously been machined.

According to a different embodiment, the semiconductor body 20 coincides with the substrate 21, and the latter is of a previously machined type, where, for example, the first side 20a and/or the second side 20b have undergone a cleaning step.

According to a further embodiment, the semiconductor body 20 includes one or more layers set on top of one another (for example, a substrate, one or more epitaxial layers, one or more dielectric layers, one or more conductive layers) and/or implanted regions, formed in a way in itself known on the first side 20a and/or on the second side 20b.

Said layers set on top of one another and/or implanted regions form, for example, one or more electronic components, or parts of one or more electronic components, such as, but not only, transistors, resistors, capacitors, inductors, etc. In addition, the semiconductor body 20 may comprise parts of microelectromechanical systems (MEMS).

FIG. 8 and the subsequent figures show, schematically, electronic components (for example, but not only, transistors, diodes, resistors, capacitors, etc.) integrated in the wafer 100, designated as a whole by the reference number 28.

Figure 9:
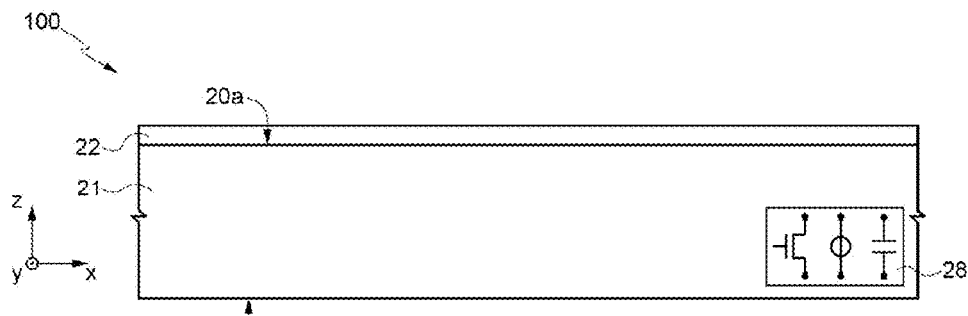

With reference to FIG. 9, formed over the first side 20a of the semiconductor body 20, is an intermediate layer 22, designed to form an interface between the semiconductor body 20 and top layers, in particular for improving the adhesion of said top layers on the wafer 100.

Then (FIG. 10), formed over the intermediate layer 22 is a first barrier layer 25. According to one embodiment, the first barrier layer 25 is formed on the wafer 100 in such a way as to cover the wafer 100 completely. According to a different embodiment, the first barrier layer 25 is formed on part of the wafer 100 so as to cover portions of the wafer 100 in which it is desired to eliminate, or at least reduce, the risk of contamination by metal ions. The first barrier layer 25 is made of a material designed to block migration or passage of metal ions through it, and is made, for example, of titanium (Ti), or titanium compounds (e.g., TiN, TiW, etc.), or tantalum (Ta), or tantalum compounds (e.g., TaN, TaNTa, etc.).

The first barrier layer 25 moreover guarantees a certain degree of adhesion with the intermediate underlying layer 22 so that, in use, there are no undesirable phenomena of detachment of said first barrier layer 25. The present applicant has found that a titanium-tungsten alloy (TiW) guarantees an adequate adhesion. According to one embodiment, the first barrier layer 25 has a thickness comprised between 5 nm and 50 nm, in particular approximately 10 nm, and is formed, according to one embodiment, by sputtering, in a way in itself known. The present applicant has found that the aforementioned values of thickness of the first barrier layer 25 can be used irrespective of the specific type of material chosen for the first barrier layer 25.

Then, once again with reference to FIG. 10, a magnetic layer 27 is formed on the wafer 100, in particular over the first barrier layer 25.

In general, the magnetic layer 27 may be replaced by a layer including metal material that constitutes a possible source of contamination for the semiconductor body 20. According to one embodiment, the magnetic layer 27 includes alloys of cobalt, nickel or iron, such as CoZrTa, NiFe, CoFeHfO, CoFeSiB, CoZrO, and others still.

Diamagnetic and/or paramagnetic materials may be used to form the magnetic layer 27 according to further embodiments.

According to one embodiment, the magnetic layer 27 is made of CoFeSiB, and has a thickness of between 0.1 μm and 100 μm, in particular 1 μm, and is formed using the sputtering technique, in a way in itself known. The present applicant has verified that the aforementioned values of thickness of the magnetic layer 27 can be used irrespective of the specific material chosen for the magnetic layer 27.

Then, formed over the magnetic layer 27 is a second barrier layer 29, similar to the first barrier layer 25, formed, according to one embodiment, by sputtering, in a way in itself known.

Figure 10:
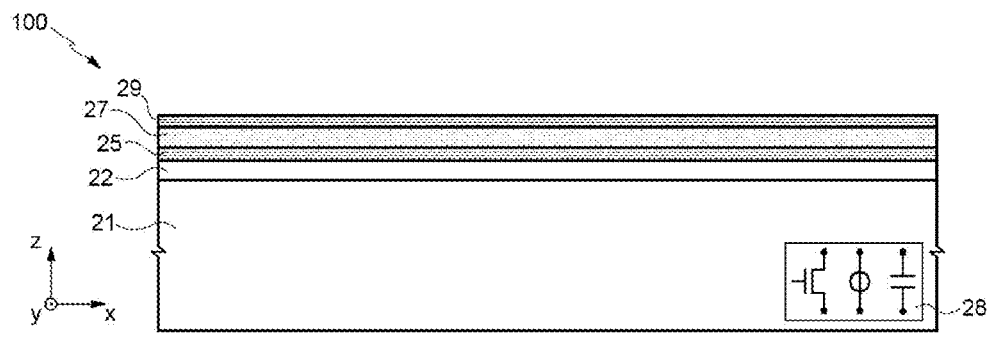
Figure 11:
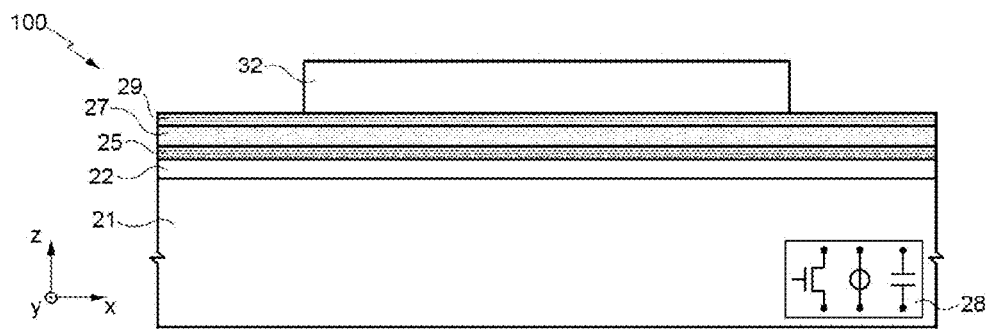

According to the embodiment of FIG. 10, the second barrier layer 29 is formed on the wafer 100 in such a way as to cover the wafer 100 completely.

According to a different embodiment, the second barrier layer 29 is formed on part of the wafer 100 so as to cover the magnetic layer 27 completely, but leaving the remaining portions of the wafer 100 that do not include the magnetic layer 27 exposed.

Irrespective of the embodiment, the second barrier layer 29 is made of a material designed to block migration or passage of metal ions through it, for example, titanium (Ti) or compounds comprising titanium (e.g., TiN, TiW), or tantalum (Ta), or compounds comprising tantalum (e.g., TaN, Ta2N, TaNTa).

According to one embodiment, the second barrier layer 29 is made of titanium nitride TiN, and has a thickness of between 10 nm and 500 nm, in particular 25 nm. The present applicant has found that the aforementioned values of thickness of the second barrier layer 29 may be used irrespective of the specific type of material chosen for the second barrier layer 29 given that said material is designed to operate as barrier against metal ions of the magnetic layer 27.

The document by Stimmell, Jim "Properties of dc magnetron reactively sputtered TiN"—Journal of Vacuum Science & Technology B: Microelectronics and Nanometer Structures, 1986, describes a method of formation of a layer of titanium nitride (TiN) having barrier properties against generic metal contaminants.

The document by Min, Kyung-Hoon, "Comparative study of tantalum and tantalum nitrides ($Ta_2N$ and TaN) as a diffusion barrier for Cu metallization"—Journal of Vacuum Science & Technology B: Microelectronics and Nanometer Structures, 1996, describes a method of formation of a layer of tantalum (Ta) or tantalum nitride (TaN, $Ta_2N$).

During the steps of FIG. 10, there might occur contamination of the deposition equipment in which deposition of the magnetic layer 27 is carried out. If the deposition of the magnetic layer 27 and of the first and second barrier layers 25, 29 are carried out in one and the same deposition chamber, the risk of contamination is limited to a single piece of manufacturing equipment.

Next (FIG. 11), formed on the wafer 100 is a mask 32, for example made of photoresist. Alternatively, the mask 32 is a hard mask, for example made of silicon oxide, silicon nitride, or some other material chosen according to the need and configured for operating as shield during etching.

The mask 32 is formed so as to cover portions of the wafer 100 that it is desired to protect from a subsequent etching step. In particular, the mask 32 defines the shape that it is desired to bestow on the magnetic layer 27 at the end of the manufacturing steps.

Figure 12:
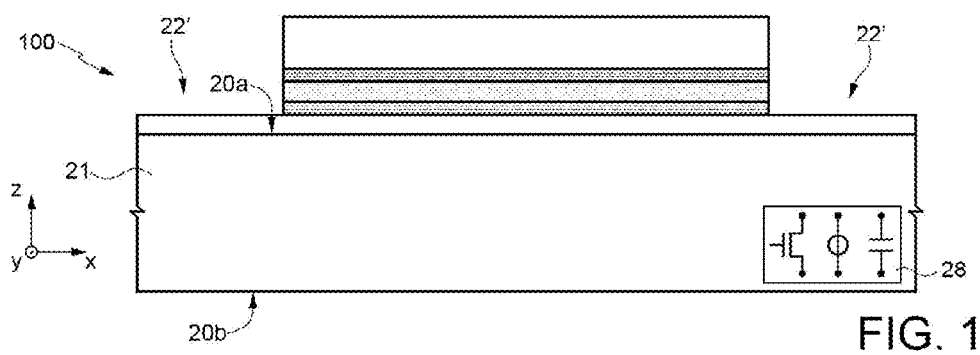
Figure 13:
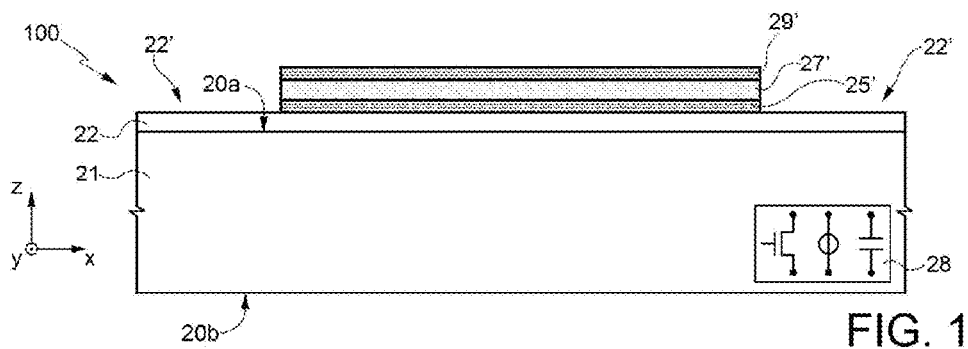

With reference to FIG. 12, an etching step, in particular a step of wet etching with a base of 30% hydrogen peroxide ($H_2O_2$) at a temperature of approximately 50° C., enables removal of the second barrier layer 29, made of TiN, in areas of the portions of the latter not covered by the mask 32. A subsequent etching wet, in particular with a mixture with a base of sulphuric acid and hydrogen peroxide diluted in water (known as DSPM—"dilute sulphuric peroxide mixture"), in a ratio $H_2SO_4:H_2O_2:H_2O$ of 2:1:70, at a temperature of approximately 25° C., enables removal of the CoFeSiB magnetic layer 27, in areas corresponding to the portions of the latter not covered by the mask 32 and exposed by the previous step of etching of the second barrier layer 29. Finally, a further etching with a base of 30% hydrogen peroxide ($H_2O_2$) at a temperature of approximately 50° C. enables removal of the first barrier layer 25, made of TiW, in areas corresponding to the non-protected portions of the latter. It is evident that other types of etching may be used (for example, using a different etching chemistry, or varying the ratios of concentration of the etching chemistry).

Portions 22' of the intermediate layer 22 not protected by the mask 32 are thus exposed. Also during the step of FIG. 12 there is a possible risk of contamination of the equipment used for etching of the magnetic layer 27 and of the first and second barrier layers 25, 29.

In order to reduce the risk of any subsequent contamination, it is advisable to discharge the etching solution at the end of the steps of FIG. 12.

The etching steps of FIG. 12 enable formation of a magnetic element 27' having desired shape (in particular, as defined by the mask 32), delimited at the bottom and at the top by respective first and second portions 25', 29' of the first barrier layer 25 and, respectively, of the second barrier layer 29.

Then (FIG. 13), a step of removal of the mask 32 is carried out and (FIG. 14) with a step of formation of a protective layer 36 over the wafer 100. The protective layer 36 is obtained, for example by passivation, in a way in itself known, of the wafer 100, or alternatively by deposition of dielectric material.

It is thus possible (FIG. 15), to proceed with fabrication of the electronic devices 28 and/or with steps of opening of one or more through holes 38 through the protective layer 36, for example to form electrical contacts from/to the integrated electronic devices 28.

Figure 16:
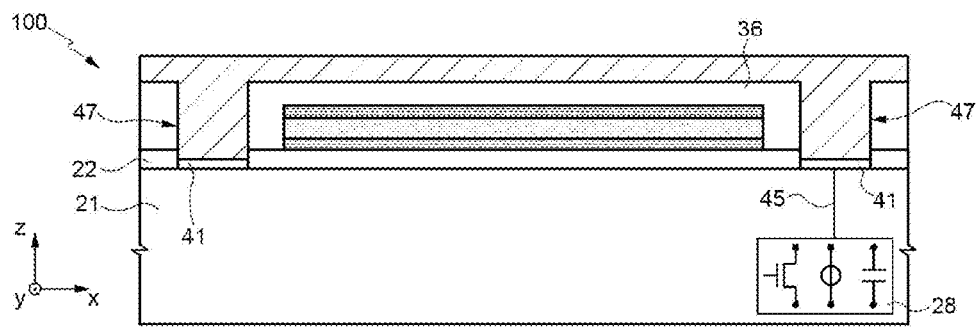
FIG. 16 shows, in cross-sectional view, a portion of a semiconductor device according to a another embodiment.

For example, according to one embodiment shown in FIG. 16, the semiconductor body 20 includes one or more conductive pads 41 arranged laterally, in the direction X, with respect to the stack formed by the first and second barrier elements 25', 27 and by the magnetic element 27'. Said conductive pads 41 are formed on the first side 20a of the semiconductor body 20 or integrated in the semiconductor body 20. The conductive pads 41 are, for example, electrically coupled to one or more of the electronic devices 28 by means of one or more conductive paths (which extend parallel to the plane XY), and/or one or more conductive plugs 45 (which extend in the semiconductor body 20 in the direction Z).

Figure 15:
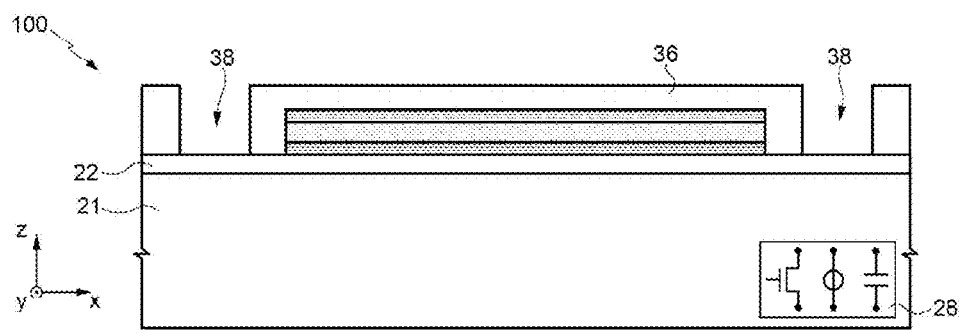

The through holes 38 of FIG. 15 are, in this case, formed at least in part on top of one another (in the direction Z) on the conductive pads 41 so as to form an access towards the conductive pads 41 from the outside of the wafer 100. The through holes 38 are, for example, filled with conductive material, such as metal, so as to form respective conductive "plugs" 47, which extend through the through holes 38, in electrical contact with the conductive pads 41. It is thus possible to form an electrical access, from the outside of the wafer 100, towards the electronic devices 38 and/or towards the magnetic element 27'.

According to the manufacturing steps of FIGS. 8-15 and 16, any possible contamination of the semiconductor body 20 is eliminated, or in any case considerably reduced, thanks to formation of the first barrier layer 25 designed to operate as barrier against metal contaminants from the magnetic layer 27 towards the underlying semiconductor body 20.

Figure 1:
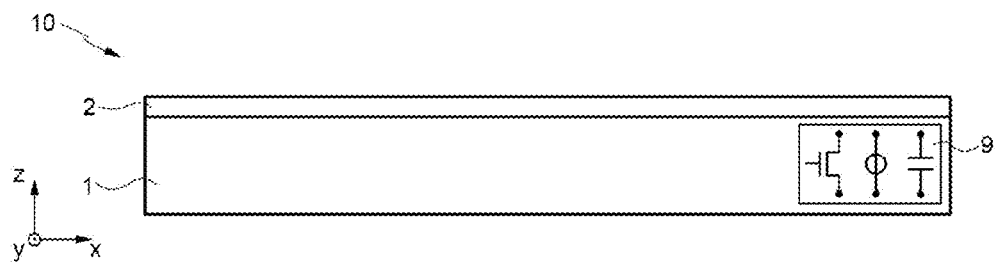
FIGS. 1-7 show, in lateral cross-sectional view, steps for manufacturing a semiconductor device including a magnetic element according to an embodiment of a known type.
Figure 2:
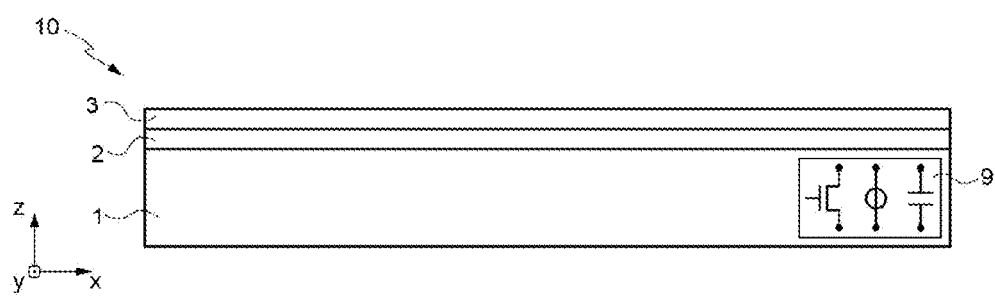
Figure 3:
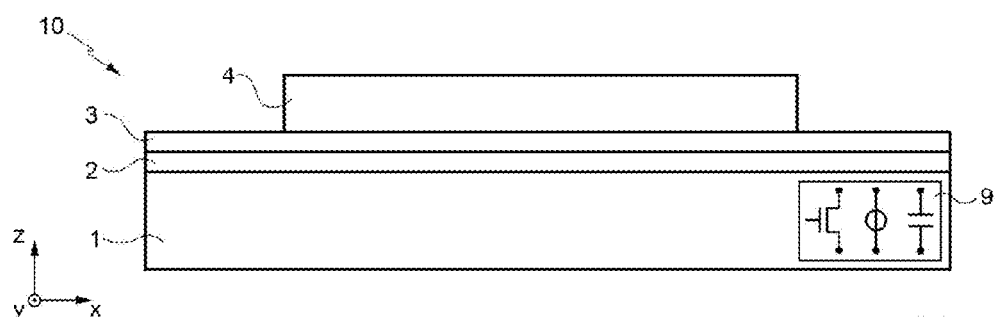
Figure 4:
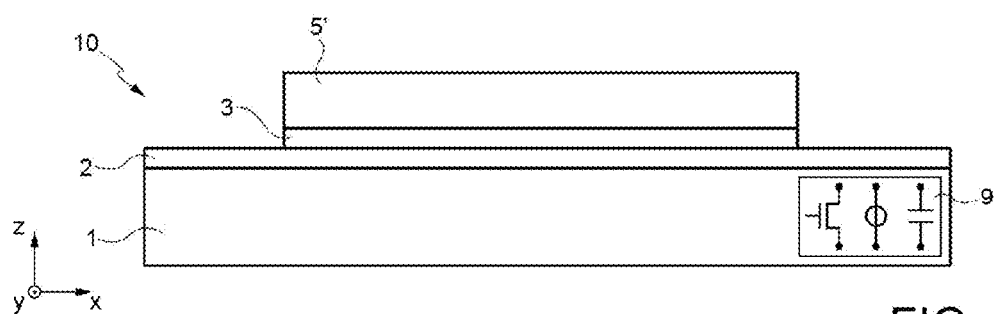
Figure 5:
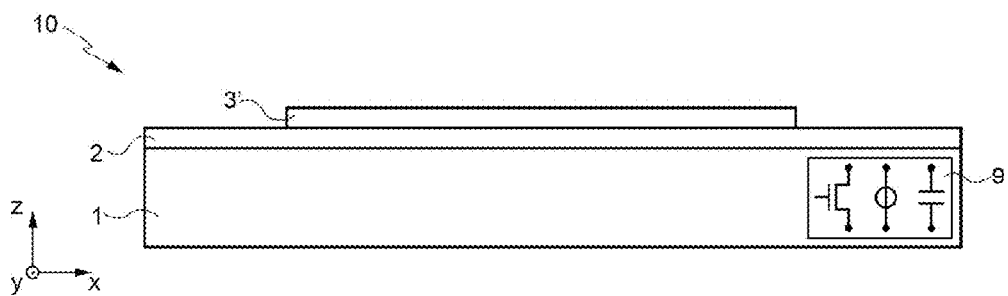
Figure 6:
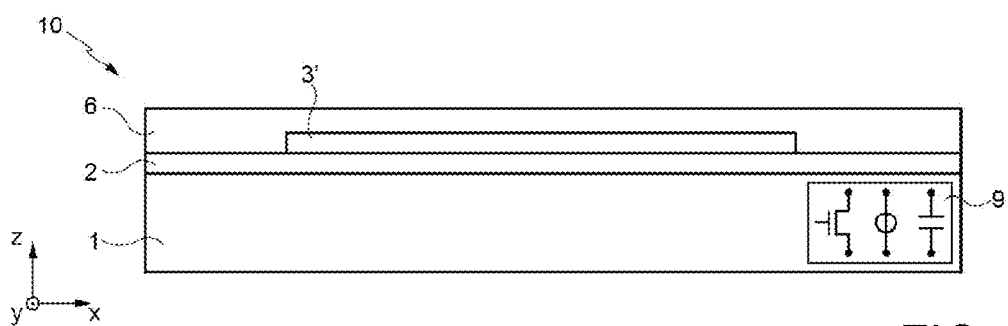
Figure 7:
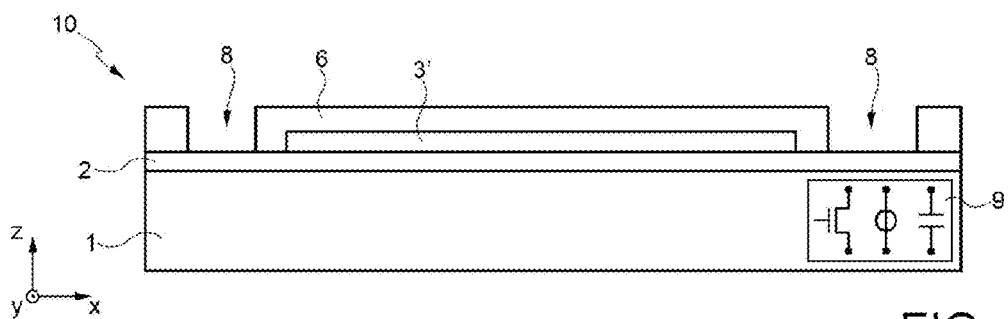
Figure 14:
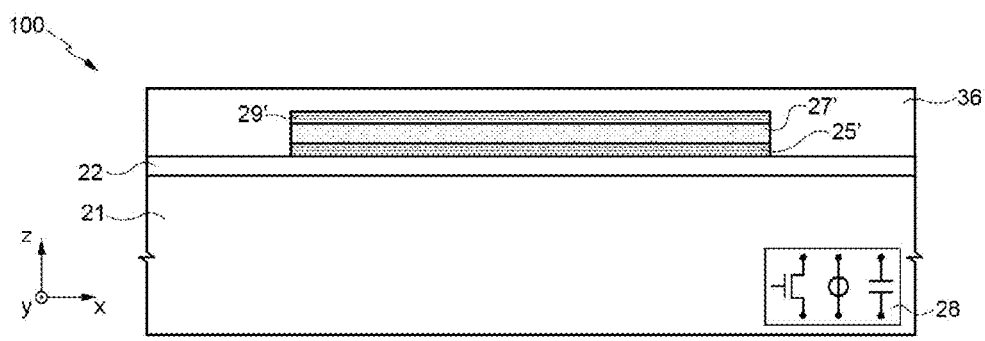

In addition, also any contamination of the equipment used during the manufacturing steps according to FIGS. 8-15 and 16 is considerably reduced as compared to known processes (see FIGS. 1-7), thanks to the presence of the second barrier layer 29, which reduces exposure of the magnetic layer 27 during the step of formation and removal of the mask 32 (FIG. 11 and FIG. 13, respectively) and during subsequent manufacturing steps, such as for example formation of the protective layer 36 of FIG. 14. These steps are, instead, critical according to procedures of a known type (see, for example, FIGS. 3, 4 and 6 and the corresponding description).

According to an embodiment, only two pieces of manufacturing equipment are to be checked to verify contamination from undesirable metals, in particular the chamber for deposition of the magnetic layer 27 (FIG. 10) and the wet-etching equipment for removal of selective portions of the magnetic layer 27 (FIG. 12).

The manufacturing steps described according to an embodiment may be applied to machining of a semiconductor wafer for manufacturing a generic semiconductor device, for example electronic devices and/or microelectromechanical devices (MEMS), where there is the need to form a magnetic layer of a material including contaminating metals and the simultaneous need to reduce the contamination of the wafer itself to a minimum.

The above devices include, for example:
integrated magnetic sensors for detecting external magnetic fields;
contactless current sensors based upon the Hall effect;
proximity magnetic-field sensors;
fully integrated DC-DC converters including micro-inductors;
integrated transformers; and
MEMS devices.

In all the aforementioned devices, magnetic elements, which may bring about a contamination of the wafer on which the devices themselves are formed, are arranged on a layer similar to the first barrier layer 25 (as a protection of the wafer from a possible contamination) and/or covered with a layer similar to the second barrier layer 29 (as a protection of the micromachining equipment, and of the wafer, from possible contamination).

Figure 17:
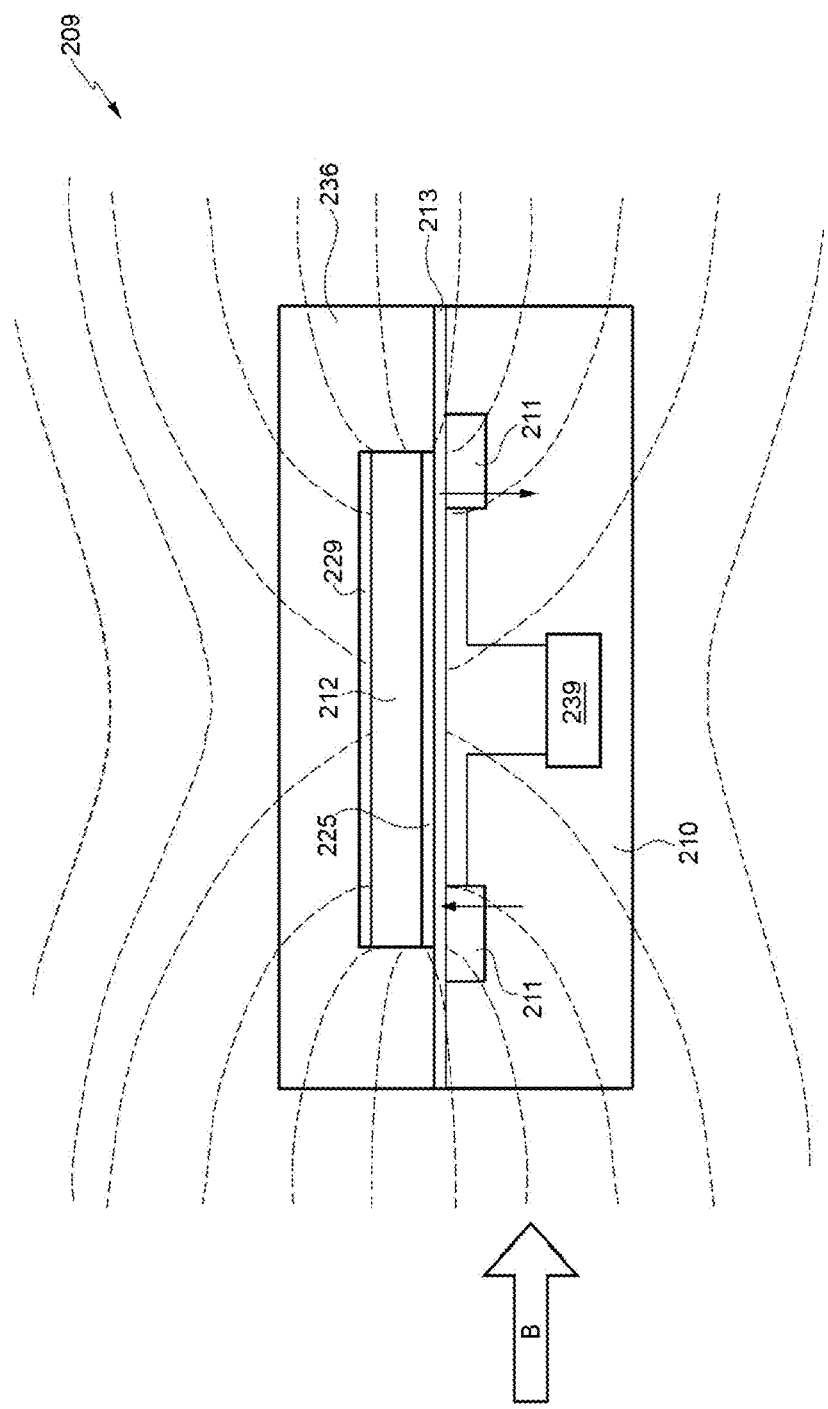
FIG. 17 shows, in cross-sectional view, a Hall sensor including a barrier structure manufactured according to the steps of FIGS. 8-15.

An example of Hall-effect sensor 209, provided with a concentrator 212, is shown in FIG. 17 in schematic cross-sectional view. The Hall sensor 209 includes, in a way in itself known, a substrate 210, made of semiconductor material, which houses a pair of Hall cells 211. A concentrator 212 extends over the surface of the substrate 210, insulated from this via an insulating layer 213, made, for example, of silicon oxide. The concentrator 212 is constituted by a strip of ferromagnetic material, the ends of which are vertically aligned to a respective Hall cell 211, obtained in a known way and hence not shown in detail. This figure moreover shows the lines of flux of an external magnetic field B having development parallel to the surface of the substrate 210, as deflected by the concentrator so as to traverse the Hall cells 211 in a direction perpendicular to the surface of the substrate 210 and hence enable detection of the external field B by the Hall cells 211, which are in themselves sensitive only to the components of the field perpendicular to the surface. The concentrator 212 enables increasing the sensitivity of the sensor 209, thanks to the capacity of modifying the lines of flux of the magnetic field B and concentrate it in the proximity of the Hall cells 211. The concentrator 212 is, for example, made of a "soft" ferromagnetic material (i.e., it can be magnetized easily and does not maintain the magnetization after the external magnetic field has been removed). For example, a cobalt-based amorphous alloy or else a permalloy (NiFe) may be used.

According to an embodiment, a first barrier layer 225 is formed between the insulating layer 213 and the concentrator 212. In addition, a second barrier layer 229 is formed over the concentrator 212. The first and second barrier layers 225, 229 are similar to the first and second barrier layers 25, 29, respectively, of FIGS. 10-15 and 16, and are formed in a way similar to what has been already described with reference to FIG. 10, have the same properties, and afford the same advantages. The magnetic layer 27 (or, rather, the magnetic element 27') is here represented by the concentrator 212.

A passivation layer 236 extends on the concentrator 212 and on the exposed portions of the insulating layer 213.

Electronic components 239 may be integrated in the same chip that houses the Hall sensor 209, inside and/or over the substrate 210. For example, the electronic components 239 may constitute a circuit for reading the Hall cells 211.

From an examination of the characteristics of the embodiments provided according to the present disclosure, the advantages are evident.

Finally, it is clear that modifications and variations may be made to what has been described and illustrated herein, without thereby departing from the sphere of protection of the present invention, as defined in the annexed claims.

For example, the first and second barrier layers 25, 29 may have any shape such as to adapt to possible underlying layers (not shown in FIGS. 8-15). In particular, one, or both of them, may have, in cross-sectional view, a non-planar shape. Likewise, also the magnetic layer 27 may have any shape, either planar or non-planar.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:
1. A method for manufacturing a semiconductor device comprising the steps of:
(a) providing a semiconductor body having a first side and a second side opposite the first side;
(b) forming, on the first side of the semiconductor body, a first barrier element comprising a first material configured to act as barrier against metal ions;

(c) forming, on the first barrier layer, a magnetic element comprising a second material having magnetic properties;

(d) forming, on the magnetic layer, a second barrier element comprising a third material configured to act as barrier against metal ions;

(e) forming at least one electronic component in the semiconductor body;

(f) forming at least one first conductive pad on the first side of the semiconductor body alongside the first barrier element, the magnetic element, and the second barrier element; and (g) electrically coupling the at least one first conductive pad to the at least one electronic component.

2. The method according to claim 1, wherein step (c) comprises forming the magnetic element completely overlying the first barrier element, and step (d) comprises forming the second barrier element completely overlying the magnetic element.

3. The method according to claim 1, wherein the first and third materials are configured to act as barrier against metal ions associated with the second material.

4. The method according to claim 1, wherein the first and third materials comprise at least one of titanium, tantalum, compounds or alloys of titanium including TiN and TiW, and compounds or alloys of tantalum including TaNTa, TaN, and Ta2N.

5. The method according to claim 1, wherein the second material comprises a ferromagnetic material comprising at least one of CoZrTa, NiFe, CoFeHfO, CoFeSiB, and CoZrO.

6. The method according to claim 1, wherein steps (b), (c) and (d) further comprise, respectively:

depositing, on the first side of the semiconductor body, the first material to form a first barrier layer, and removing selective portions of the first barrier layer so as to form the first barrier element;

depositing, on the first barrier layer, the second material to form a magnetic layer, and removing selective portions of the magnetic layer so as to form the magnetic barrier; and depositing, on the magnetic layer, the third material to form a second barrier layer, and removing selective portions of the second barrier layer so as to form the second barrier element, and removing selective portions of the second barrier layer so as to form the second barrier element.

7. The method according to claim 6, wherein the steps of depositing the first barrier layer, the magnetic layer, and the second barrier layer are performed in the same reaction chamber.

8. The method according to claim 6, wherein the steps of removing selective portions of the first barrier layer, the magnetic layer and the second barrier layer are performed in the same etching chamber.

9. The method according to claim 6, further comprising, before carrying out the steps of removing the selective portions of the first barrier layer, of the magnetic layer, and the second barrier layer, the step of forming:

a photoresist mask on the second barrier layer, with the photoresist mask outlining a desired shape of the first barrier element, the magnetic element, and of the second barrier element.

10. The method according to claim 1, further comprising the step of forming a protective layer over the first side of the semiconductor body so as to cover the first barrier element, the magnetic element, and the second barrier element.

11. The method according to claim 1, further comprising the step of forming an intermediate insulating layer comprising a dielectric material between the semiconductor body and the first barrier layer.

12. The method according to claim 1, wherein the at least one electronic component is configured so that the semiconductor device is configured as at least one of an integrated magnetic sensor for detecting external magnetic fields, a contactless current sensor based upon the Hall effect, a proximity magnetic-field sensor, an integrated DC-DC converter, an integrated transformer, and MEMS device.

13. A semiconductor device comprising:

a semiconductor body having a first side and a second side opposite the first side, and comprising at least one electronic component in the semiconductor body;

a first barrier element comprising a first material configured to act as barrier against metal ions, and on the first side of the semiconductor body;

a magnetic element comprising a second material having magnetic properties, and on the first barrier layer; and a second barrier element comprising a third material configured to act as barrier against metal ions, and on the magnetic layer;

at least one first conductive pad on the first side of the semiconductor body alongside the first barrier element, the magnetic element, and the second barrier element; and at least one first conductive plug to electrically couple the at least one first conductive pad to the at least one electronic component.

14. The semiconductor device according to claim 13, wherein the magnetic element overlies completely the first barrier element, and the second barrier element overlies completely the magnetic element.

15. The semiconductor device according to claim 13, wherein the first and third materials are configured to act as a barrier against metal ions associated with the second material.

16. The semiconductor device according to claim 13, wherein the first and third materials comprise at least one of titanium, tantalum, compounds or alloys of titanium including TiN and TiW, and compounds or alloys of tantalum including TaNTa, TaN and Ta2N.

17. The semiconductor device according to claim 13, wherein said second material comprises a ferromagnetic comprising at least one of CoZrTa, NiFe, CoFeHfO, CoFeSiB, CoZrO.

18. The semiconductor device according to claim 13, further comprising a protective layer, which extends over the first side of the semiconductor body so as to cover the first barrier element, the magnetic element, and the second barrier element.

19. The semiconductor device according to claim 13, further comprising an intermediate insulating comprising a dielectric material between the semiconductor body and the first barrier element.

20. The semiconductor device according to claim 13, wherein the at least one electronic component is configured so that the semiconductor device is configured as at least one of an integrated magnetic sensor for detecting external magnetic fields, contactless current sensor based upon the Hall effect, a proximity magnetic-field sensor, an integrated DC-DC converter, an integrated transformer, and a MEMS device.

* * * * *

UNITED STATES PATENT AND TRADEMARK OFFICE
CERTIFICATE OF CORRECTION

Page 1 of 1

PATENT NO. : 9,105,568 B2
APPLICATION NO. : 14/104934
DATED : August 11, 2015
INVENTOR(S) : Paolo Iuliano et al.

It is certified that error appears in the above-identified patent and that said Letters Patent is hereby corrected as shown below:

Claims

| | | |
|---|---|---|
| Column 11, Line 58, Claim 9 | Delete: "of the magnetic" | Insert: --the magnetic-- |
| Column 11, Line 62, Claim 9 | Delete: "of the second" | Insert: --the second-- |
| Column 12, Line 13, Claim 12 | Delete: "and MEMS" | Insert: --and a MEMS-- |

Signed and Sealed this
Twenty-second Day of December, 2015

Michelle K. Lee
*Director of the United States Patent and Trademark Office*